(12) United States Patent
Aoki

(10) Patent No.: US 10,825,908 B2
(45) Date of Patent: Nov. 3, 2020

(54) SEMICONDUCTOR DEVICE

(71) Applicant: Sanken Electric Co., Ltd., Saitama (JP)

(72) Inventor: Hironori Aoki, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 88 days.

(21) Appl. No.: 16/104,761

(22) Filed: Aug. 17, 2018

(65) Prior Publication Data

US 2020/0027956 A1   Jan. 23, 2020

(30) Foreign Application Priority Data

Jul. 18, 2018 (JP) .................. 2018-135136

(51) Int. Cl.
| H01L 29/778 | (2006.01) |
| H01L 29/423 | (2006.01) |
| H01L 29/20  | (2006.01) |
| H01L 21/311 | (2006.01) |
| H01L 29/40  | (2006.01) |

(52) U.S. Cl.
CPC .. *H01L 29/42316* (2013.01); *H01L 21/31144* (2013.01); *H01L 29/2003* (2013.01); *H01L 29/402* (2013.01); *H01L 29/778* (2013.01)

(58) Field of Classification Search
CPC ............. H01L 29/778; H01L 29/66431; H01L 29/66462
See application file for complete search history.

(56) References Cited

U.S. PATENT DOCUMENTS

| 7,315,076 B2* | 1/2008 | Nomura | H01L 21/76804 257/637 |
| 10,192,973 B2* | 1/2019 | Park | H01L 29/66795 |
| 2004/0166668 A1* | 8/2004 | Ito | H01L 21/76804 438/637 |
| 2014/0197421 A1* | 7/2014 | Dora | H01L 29/1608 257/76 |
| 2014/0231823 A1* | 8/2014 | Chowdhury | H01L 21/283 257/76 |
| 2014/0291774 A1* | 10/2014 | Nishi | H01L 29/42316 257/410 |
| 2015/0263112 A1* | 9/2015 | Lal | H01L 27/0883 257/330 |

FOREIGN PATENT DOCUMENTS

JP   2018-006481 A   1/2018

* cited by examiner

*Primary Examiner* — Michele Fan
(74) *Attorney, Agent, or Firm* — Hawaii Patent Services; Nathaniel K. Fedde; Kenton N. Fedde

(57) ABSTRACT

A current collapse characteristic is sufficiently suppressed. After forming a large opening (first opening) passing through both a TEOS oxide layer 42 and an oxide layer 41, a thin oxide layer (third insulating layer) 43 is formed entirely covering the layers 41 and 42 and the first opening. In the thin oxide layer 43 inside the first opening, a second opening for exposing a group-III nitride semiconductor layer 10 is provided. A gate electrode 50 is formed at a slanted portion of the first opening including the second opening. A taper angle of the first opening is smaller in the TEOS oxide layer 42 than in the oxide layer 41.

4 Claims, 24 Drawing Sheets

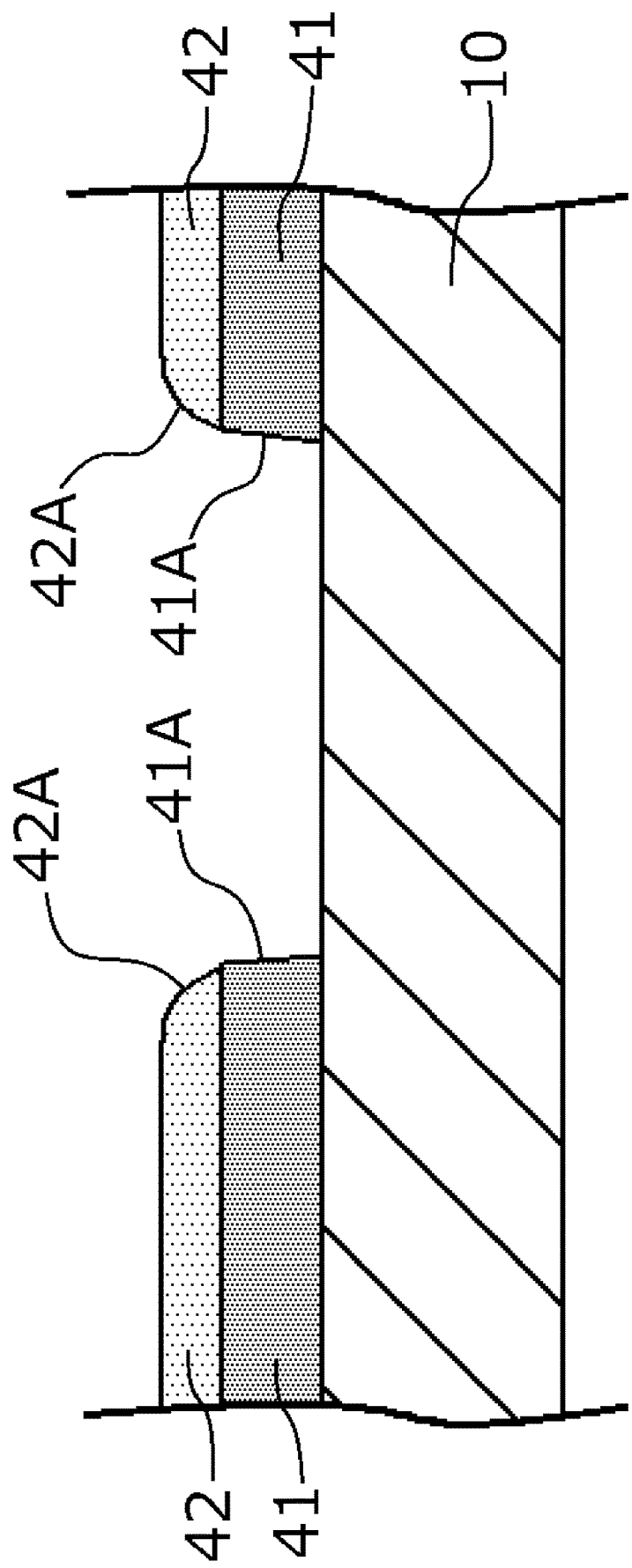

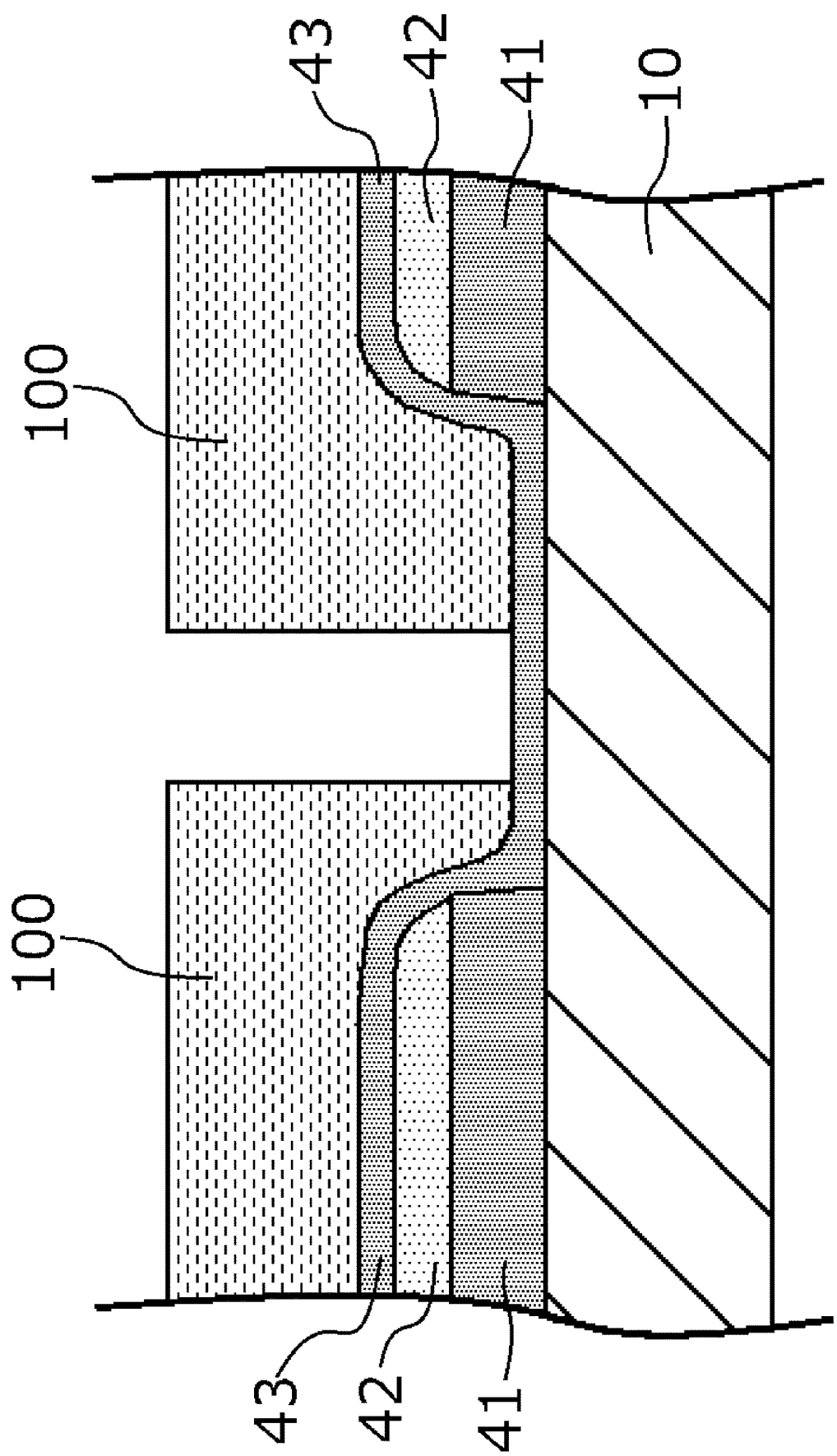

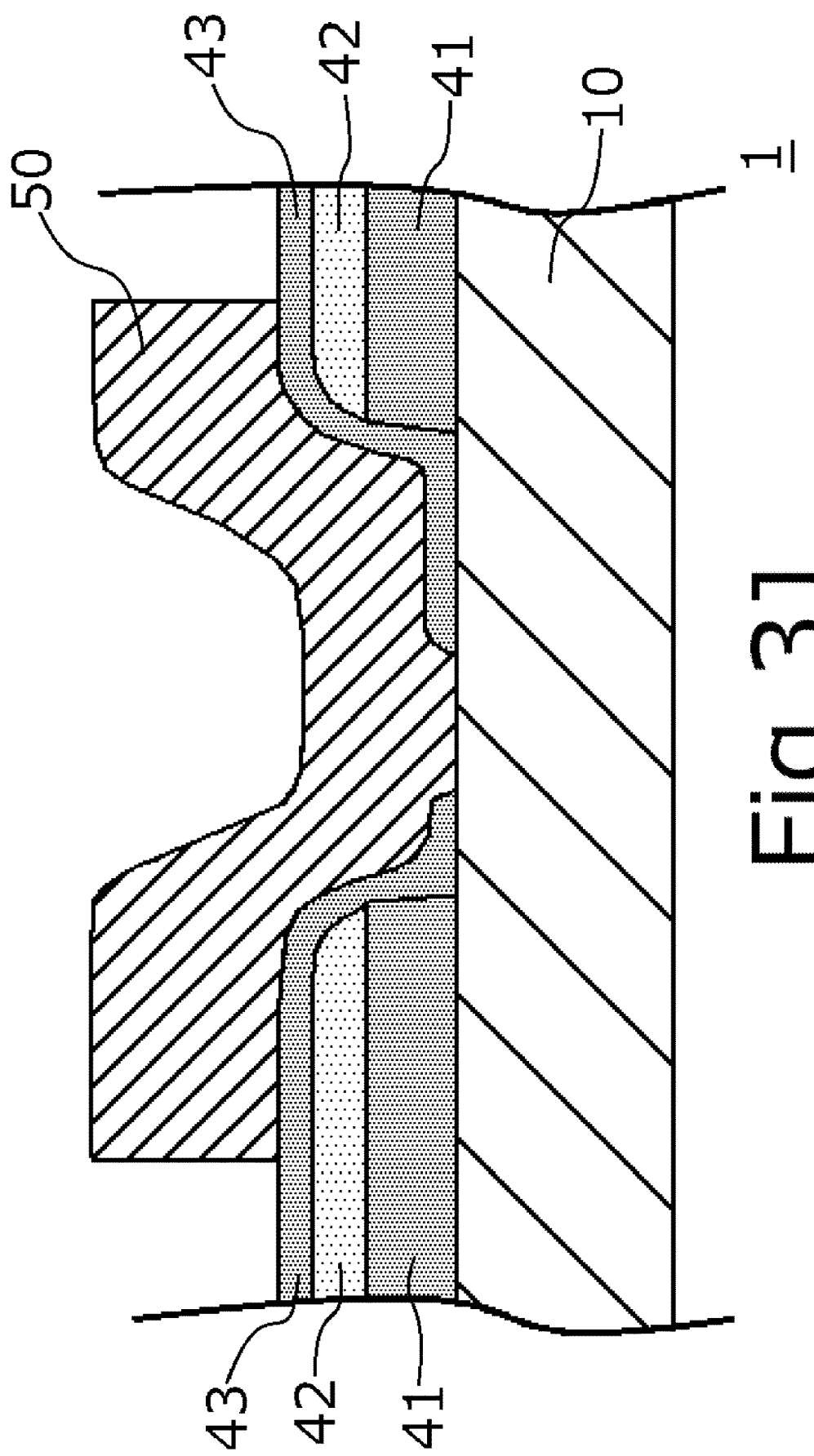

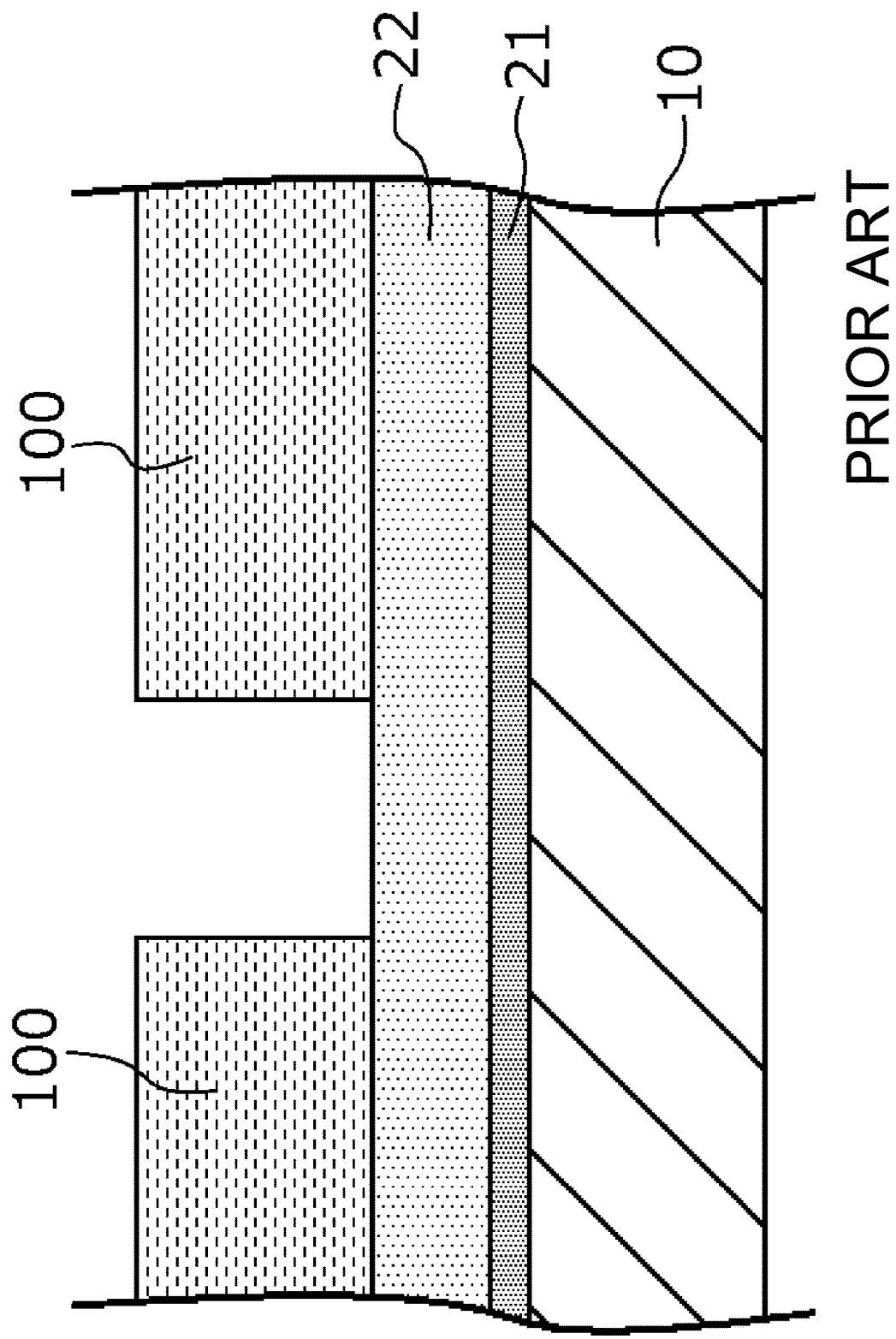

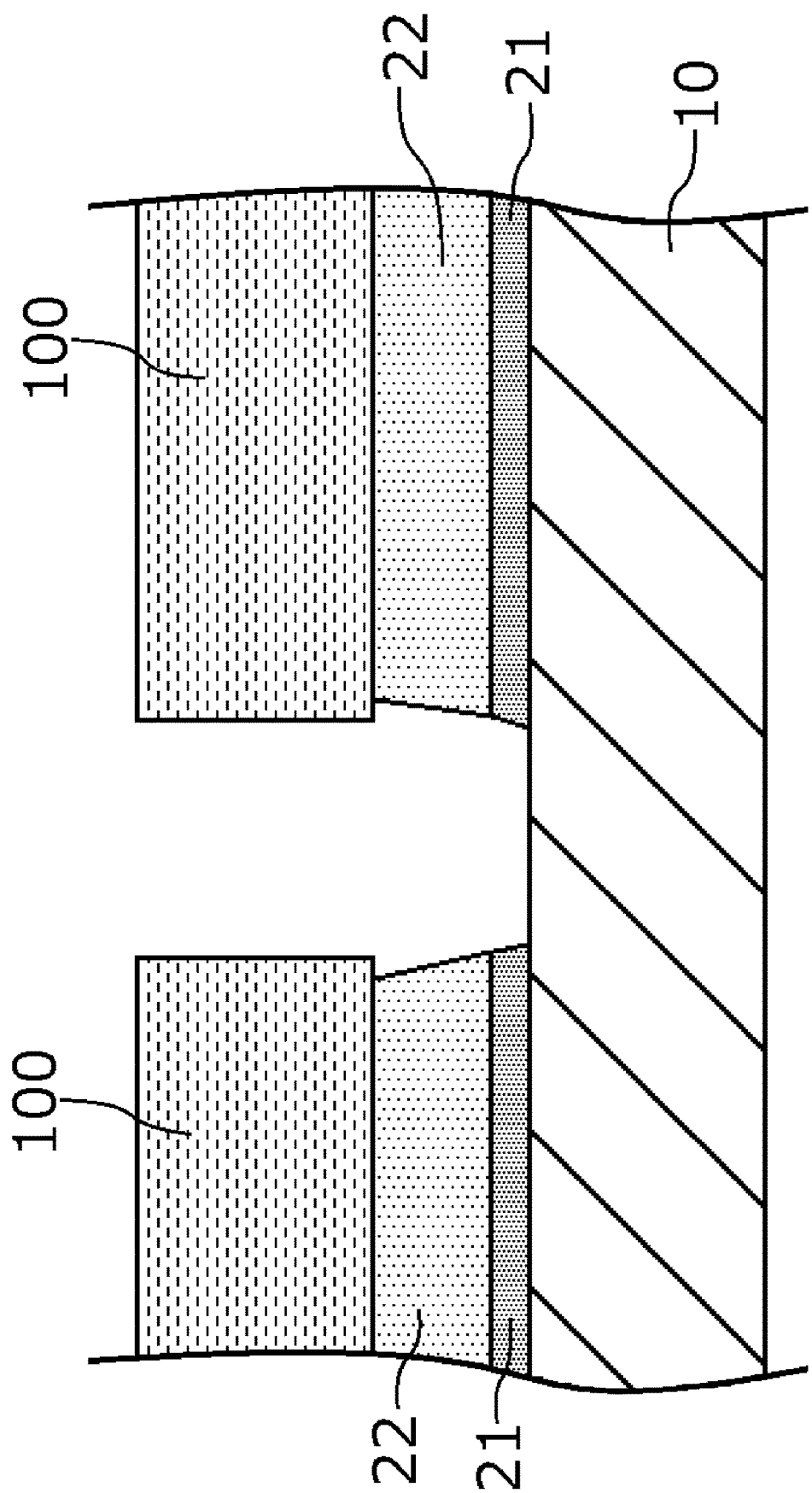

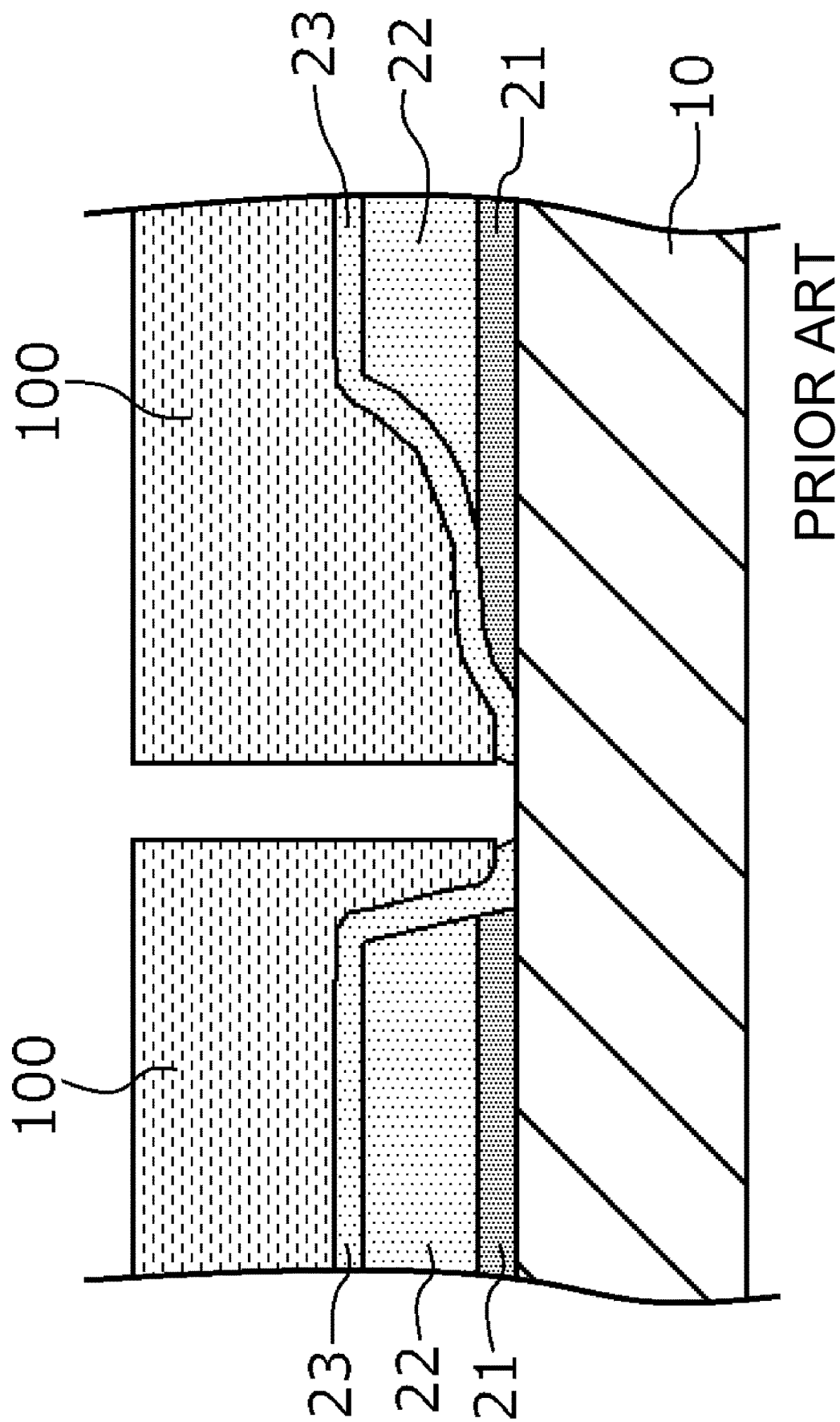

SEMICONDUCTOR DEVICE

INCORPORATION BY REFERENCE

This application is based on and claims the benefit of priority from Japanese Patent Application No. 2018-135136 filed on Jul. 18, 2018, the entire contents of which are hereby incorporated by reference.

BACKGROUND

The present invention relates to a structure of a semiconductor device in which an insulating layer and an electrode are formed on a semiconductor substrate.

HEMT (High Electron Mobility Transistor) is in use as a semiconductor device employing a group-III nitride semiconductor (such as GaN). HEMT has an issue of a current collapse phenomenon and, for relaxing the current collapse phenomenon, a field plate structure where a portion of a gate electrode faces a group-III nitride semiconductor layer across an insulating layer inserted underneath the portion is effective. It is known that by employing the field plate structure, a surface potential of and an electric field within the group-III nitride semiconductor layer underneath the field plate structure are controlled and, accordingly, the current collapse phenomenon is relaxed.

JP-2018-6481 (A) discloses a structure and a fabrication process of a semiconductor device using a gate electrode provided with such a field plate structure as described above. FIGS. 4A to 4H and FIGS. 5I to 5M are cross-sectional process diagrams showing a fabrication process of such a semiconductor device 9.

In FIG. 4A, on a group-III nitride semiconductor layer (semiconductor layer) 10 constituting an active layer of a HEMT, an oxide layer (silicon oxide layer) 21 and a TEOS oxide layer 22, which is thicker than the oxide layer 21, are sequentially formed. Here, the oxide layer 21 is a plasma silicon oxide layer which is formed by plasma CVD or the like, for example, using silane ($SiH_4$) as a source, and the TEOS oxide layer 22 is a layer formed by plasma CVD or the like, for example, using TEOS (Tetra ethoxy silane), which is liquid at room temperature, as a source. While each of the oxide layer 21 and the TEOS oxide layer 22 is an insulating layer having a composition close to $SiO_2$, they are different in composition and film quality.

Subsequently, as shown in FIG. 4B, a photoresist layer 100 to be a mask is formed by photolithography. An opening in the photoresist layer 100 in that state corresponds to a gate electrode portion (a portion to function as a gate in the HEMT). By performing dry etching in that state, an opening is formed in the TEOS oxide layer 22, as shown in FIG. 4C. Because the dry etching is anisotropic, side surfaces of the TEOS oxide layer 22 having been etched in the process become almost vertical.

Next, by performing wet etching in that state, an opening is formed also in the oxide layer 21, as shown in FIG. 4D. Because each of the TEOS oxide layer 22 and the oxide layer 21 is a layer with a composition close to $SiO_2$, while they are different in precise composition and film quality, both of the TEOS oxide layer 22 and the oxide layer 21 are etched with an identical etchant in the wet etching process, where the etching rate is higher for the TEOS oxide layer 22 than the oxide layer 21. Because the wet etching is isotropic, differently from the dry etching described above, the TEOS oxide layer 22 is laterally etched during the etching of the oxide layer 21. However, because the oxide layer 21 is thin, as described above, the amount of lateral etching of the TEOS oxide layer 22 during the process for removing the oxide layer 21 by wet etching can be limited to a small value. As a result, as shown in FIG. 4D, an opening passing through the TEOS oxide layer 22/oxide layer 21 comes to have a tapered shape.

Subsequently, after removing the photoresist layer 100 as shown in FIG. 4E, a new photoresist layer 100 is formed by photolithography again as shown in FIG. 4F. In FIG. 4F, areas covered respectively by a left and a right photoresist portions are asymmetric with reference to an opening.

When wet etching similar to that described above is performed in that state, both of the TEOS oxide layer 22 and the oxide layer 21 are isotropically etched, where the etching rate is higher for the TEOS oxide layer 22, and accordingly a cross-sectional shape provided with a gradual step such as shown in FIG. 4G is obtained. Subsequently, by removing the photoresist layer 100 (FIG. 4H) and subsequently forming a TEOS oxide layer 23 with a small thickness, the structure becomes as shown in FIG. 5I.

Subsequently, as shown in FIG. 5J, a photoresist layer 100 is formed again. An opening in the photoresist layer 100 in the present state corresponds to an area at which a gate electrode is to be in contact with the group-III nitride semiconductor layer 10 (a portion to function as a gate in the HEMT). Subsequently, by removing the thin TEOS oxide layer 23 on the group-III nitride semiconductor layer 10 at the opening area by wet etching, the group-III nitride semiconductor layer 10 can be exposed at the area as shown in FIG. 5K. After that, by removing the photoresist layer 100 (FIG. 5L) and subsequently forming a gate electrode 30 in a manner to fill the entire inside of a recessed area formed as described above, the structure becomes that shown in FIG. 5M.

In FIG. 5M, the gate electrode 30 is in contact with the group-III nitride semiconductor layer 10 in an area C and thereby functions as a gate (Schottky gate) in the HEMT. On the other hand, in an area D, the gate electrode 30 functions as a field plate facing the group-III nitride semiconductor layer 10 across the thin TEOS oxide layer 23, the oxide layer 21 and the TEOS oxide layer 22.

In a semiconductor device of the structure disclosed in JP-2018-6481 (A), improvement of the yield has been achieved but a sufficient effect of relaxing the current collapse characteristic has not been achieved. It has been estimated to be owing to a cause described below.

In the structure described above, a thinnest portion of the insulating layers underneath the field plate is a portion immediately outside the area C which consists of only the TEOS oxide layer 23, where the group-III nitride semiconductor layer 10 and the TEOS oxide layer 23 are in direct contact with each other. As described earlier, the TEOS oxide layer 23 and the oxide layer 21 are different in composition and film quality owing to the difference in source. In particular, the TEOS oxide layer 23 formed using an organic material TEOS includes a large amount of impurity, particularly a large amount of carbon (C) as such impurity, which causes the TEOS oxide layer 23 to have inferior film quality compared to the oxide layer 21.

For this reason, it has been impossible to suppress the current collapse characteristics.

The present invention has been made in view of the above-described issue, and is aimed at providing an invention to resolve the issue.

SUMMARY

To resolve the above-described issue, the present invention is configured as described below.

A semiconductor device of the present invention is a semiconductor device employing an electrode layer formed on a portion of an insulating layer formed on a semiconductor layer, wherein: the insulating layer includes a first insulating layer being in contact with the semiconductor layer and a second insulating layer formed on the first insulating layer; a first opening is formed in a manner to pass through the second and first insulating layers; also provided is a third insulating layer continuously formed with a smaller thickness than that of the first insulating layer in a manner to cover the inside of the first opening; a second opening for exposing the semiconductor layer is formed at a portion of the third insulating layer inside the first opening; the second insulating layer is thinner than the first insulating layer; compared to a first side surface of the first insulating layer constituting the first opening, a second side surface of the second insulating layer present immediately on the first side surface and constituting the first opening is formed to be more gradual; and the electrode layer is in contact with the first and second openings.

BRIEF DESCRIPTION OF THE DRAWINGS

FIG. 2E is a (5th) cross-sectional process diagram showing the fabrication method of the semiconductor device according to the exemplary embodiment of the present invention.

FIG. 2G is a (7th) cross-sectional process diagram showing the fabrication method of the semiconductor device according to the exemplary embodiment of the present invention.

FIG. 3J is a (10th) cross-sectional process diagram showing the fabrication method of the semiconductor device according to the exemplary embodiment of the present invention.

FIG. 4B is a (2nd) cross-sectional process diagram showing the fabrication method of the prior art semiconductor device.

FIG. 4D is a (4th) cross-sectional process diagram showing the fabrication method of the prior art semiconductor device.

FIG. 5K is a (11th) cross-sectional process diagram showing the fabrication method of the prior art semiconductor device.

DETAILED DESCRIPTION

Hereinafter, a semiconductor device corresponding to an exemplary embodiment of the present invention will be described. The semiconductor device includes a gate electrode on a group-III nitride compound semiconductor, where the gate electrode is provided with a field plate structure. Accordingly, a current collapse characteristic is relaxed in the semiconductor device.

Figure 1:
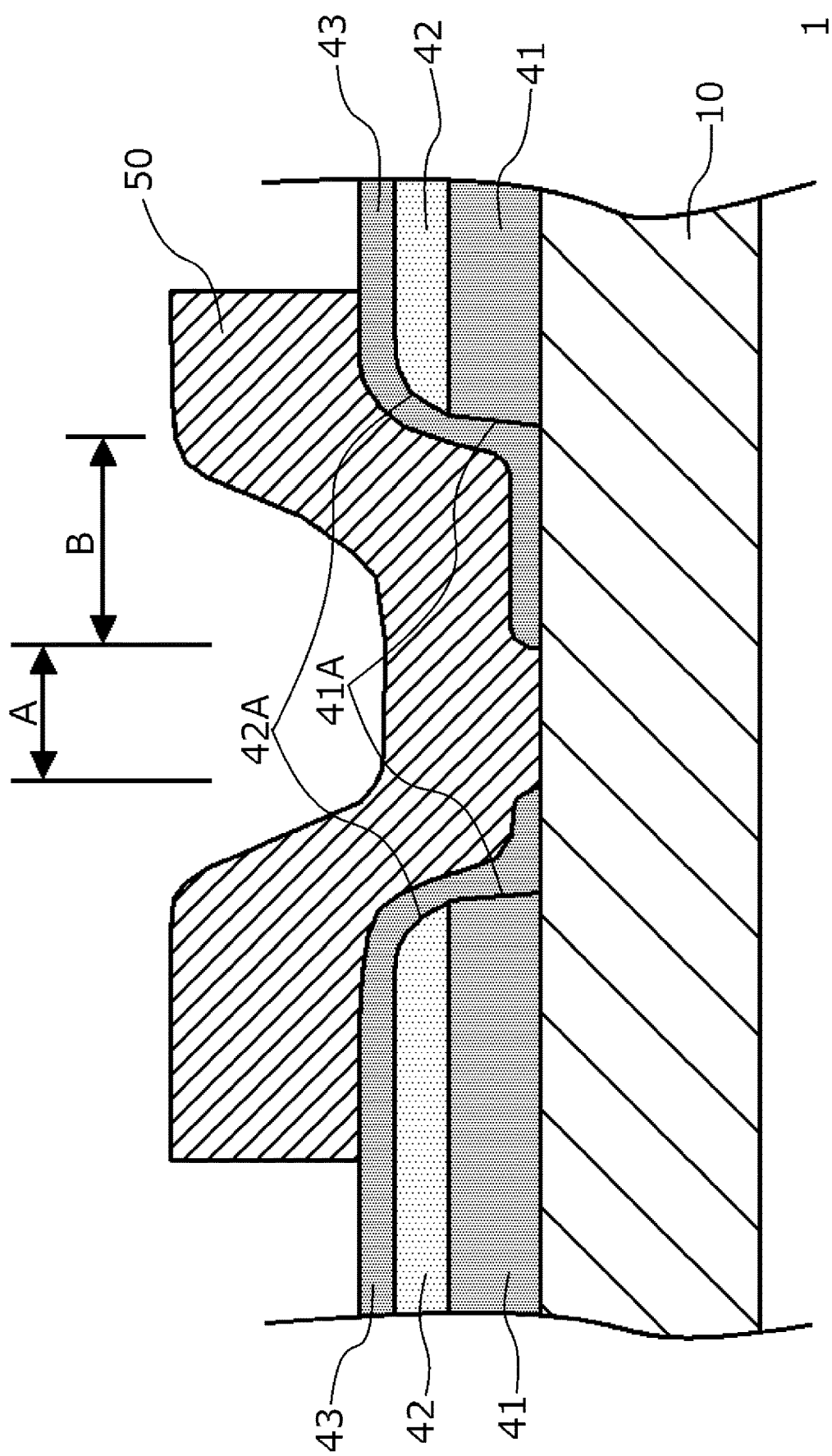
FIG. 1 is a cross-sectional diagram showing a structure of a semiconductor device according to an exemplary embodiment of the present invention.

FIG. 1 is a cross-sectional diagram showing a structure around a gate electrode in a semiconductor device 1. Also in the semiconductor device 1, a group-III nitride semiconductor (semiconductor layer) 10 is used similarly to in the semiconductor device 9 described earlier. Here, because the group-III nitride semiconductor layer 10 is formed by epitaxial growth practically, there may be a buffer layer and a substrate underneath the group-III nitride semiconductor layer 10.

On the group-III nitride semiconductor layer 10, an oxide layer (silicon oxide layer: first insulating layer) 41 is formed, and a TEOS oxide layer (second insulating layer) 42 is further formed on the oxide layer 41. The oxide layer 41 is a plasma silicon oxide layer similar to the oxide layer 21 described earlier, and the TEOS oxide layer 42 is a layer formed using TEOS (Tetra ethoxy silane) as a source, which is similar to the TEOS oxide layer 22 described earlier. Here, the TEOS oxide layer 42 is formed with a smaller thickness than that of the oxide layer 41. After forming a large opening (first opening) passing through both the TEOS oxide layer 42 and the oxide layer 41, an oxide layer (third insulating layer) 43 entirely covering the top surface is formed. The oxide layer 43 is a silicon oxide layer similar to the oxide layer 41 and is formed to have a smaller thickness than that of the oxide layer 41. As the third insulating layer 43, a nitride layer may be used instead of an oxide layer. Alternatively, a combination of an oxide layer and a nitride layer (for example, one having a nitride layer stacked on an oxide layer) may be used. In a portion of the oxide layer 43 present inside the first opening, an opening (second opening) for exposing the group-III nitride semiconductor layer 10 is provided, and accordingly the oxide layer 43 is in contact with the group-III nitride semiconductor there.

A gate electrode 50 is formed to fill the inside of the first opening including the second opening. Here, while the gate electrode 50 is illustrated as a single layer structure in FIG. 1, it is practically formed in a form of a double layer structure consisting of a layer composed of a first electrode (for example, NiO) which is in contact with the group-III nitride semiconductor layer 10 and a layer composed of a second electrode (for example, Al) having a lower resistance than that of the first electrode. In FIG. 1, the gate electrode 50 extends above the first opening and, in an area A, it is in direct contact with the group-III nitride semiconductor layer 10, thereby functioning as a gate and, in an area B, it functions as a field plate facing the group-III nitride semiconductor layer 10 across the thin oxide layer 43.

Here, as will be described later, the first opening is formed by etching (using wet etching, dry etching or both) the TEOS oxide layer 42 and the oxide layer 41. In the process, under the same etching condition, the etching rate is higher for the TEOS oxide layer 42 because of a difference in film quality between the TEOS oxide layer 42 and the oxide layer 41. Accordingly, as shown in FIG. 1, a taper angle of an etched end surface of the TEOS oxide layer 42 can be made smaller than that of the oxide layer 41. That is, by thus applying the formation of the first opening to the stack structure with the TEOS oxide layer 42 formed on the oxide layer 41, an angle of the cross-sectional shape around the first opening with respect to the top surface of the group-III nitride semiconductor layer 10 is made gradual, thereby electric field concentration in the vicinity of an end portion of the gate electrode 50 is suppressed, and accordingly the current collapse characteristic is relaxed.

Further, in the semiconductor device 1, right underneath the field plate structure, there is no direct contact of the TEOS oxide layer, which has an inferior film quality and contains a large amount of impurity such as carbon (C), with the group-III nitride semiconductor layer 10. It accordingly is possible to suppress diffusion of impurity in the TEOS oxide layer to the surface of the group-III nitride semiconductor layer 10 and harmful influence exerted on the surface of the group-III nitride semiconductor layer 10 by moisture absorption (humidity) in the TEOS oxide layer.

Figure 2A:
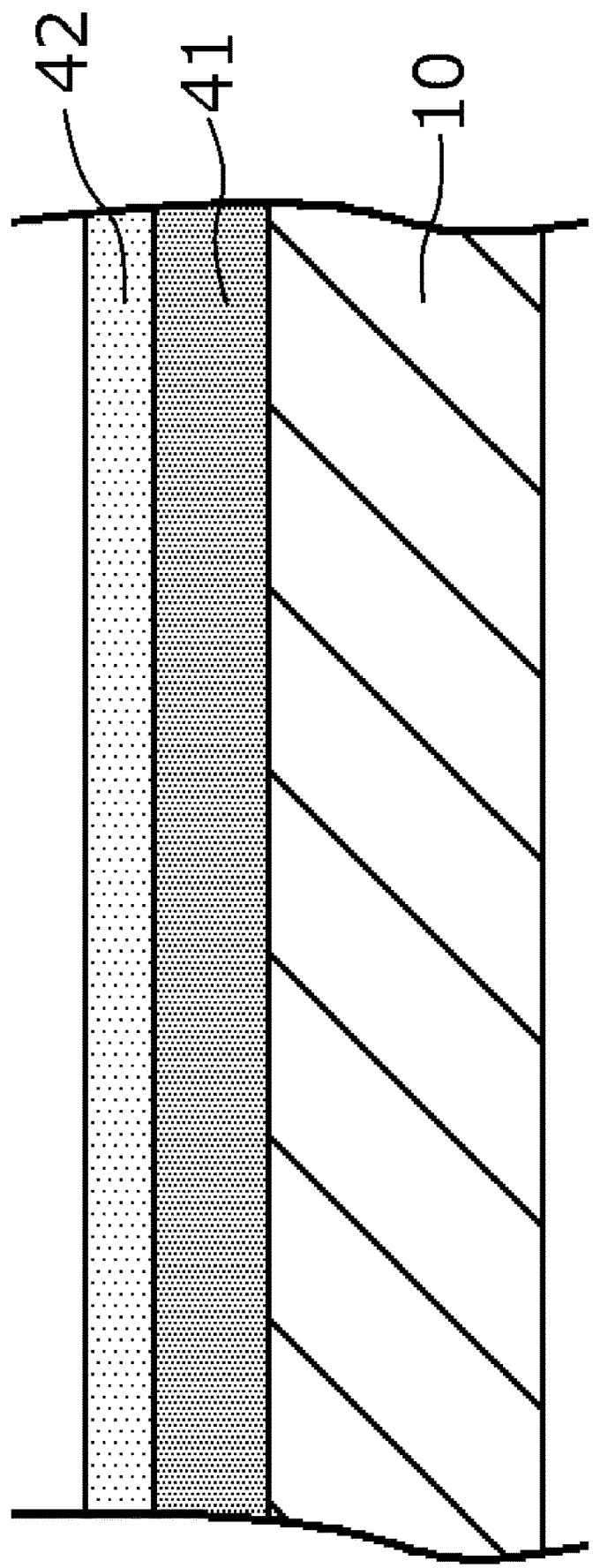
FIG. 2A is a (1st) cross-sectional process diagram showing a fabrication method of the semiconductor device according to the exemplary embodiment of the present invention.

The semiconductor device 1 may be fabricated by a fabrication method described below. FIGS. 2A to 2H and FIGS. 3I and 3J are cross-sectional process diagrams showing the fabrication method. As shown in FIG. 2A, on the group-III nitride semiconductor layer 10, the oxide layer 41 and the TEOS oxide layer 42 are formed sequentially in this order. Here, the TEOS oxide layer 42 is set to be thinner than the oxide layer 41.

Figure 2B:
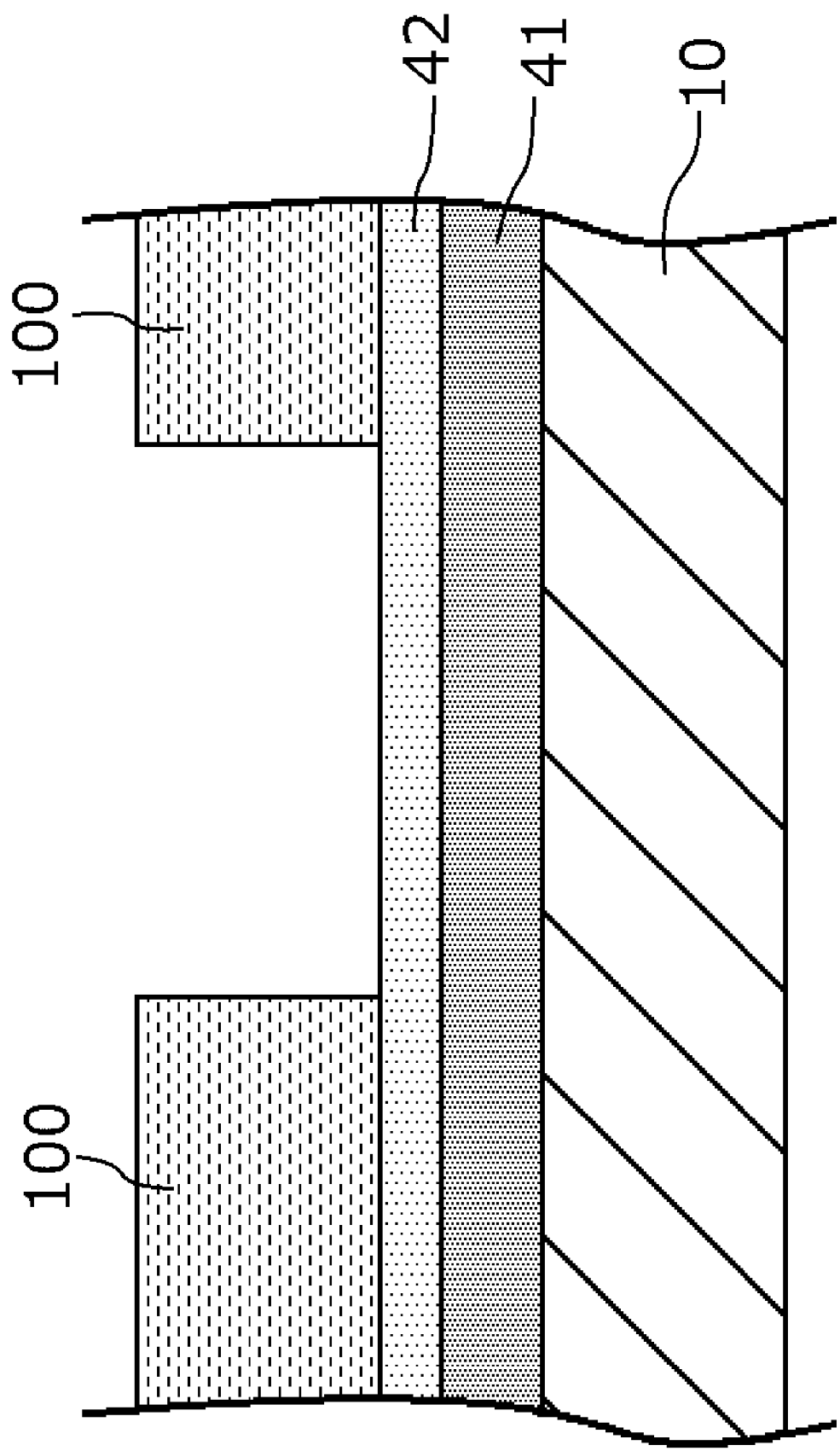
FIG. 2B is a (2nd) cross-sectional process diagram showing the fabrication method of the semiconductor device according to the exemplary embodiment of the present invention.
Figure 2C:
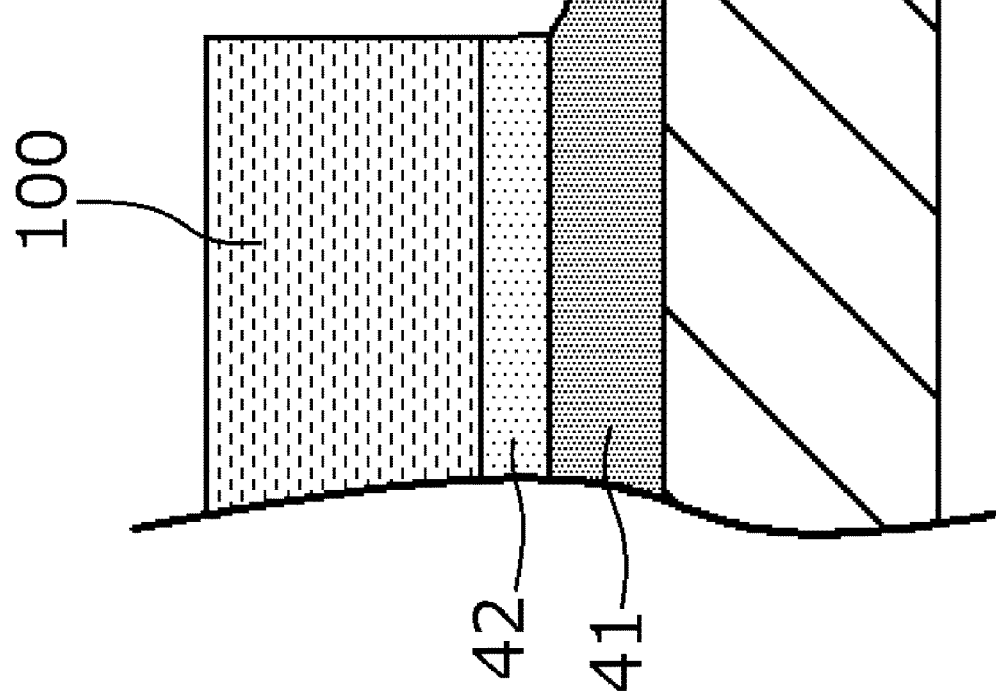
FIG. 2C is a (3rd) cross-sectional process diagram showing the fabrication method of the semiconductor device according to the exemplary embodiment of the present invention.
Figure 2D:
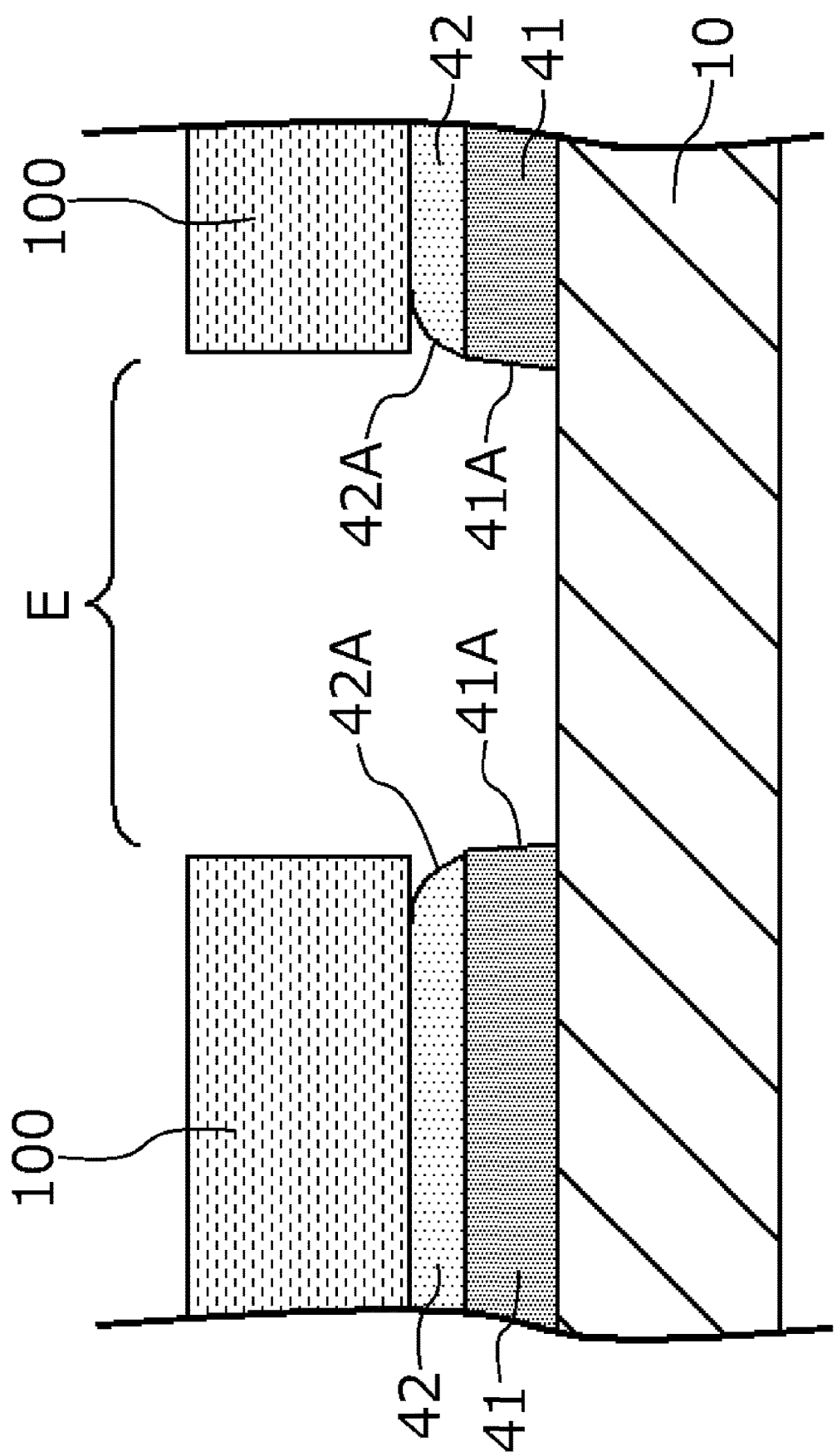
FIG. 2D is a (4th) cross-sectional process diagram showing the fabrication method of the semiconductor device according to the exemplary embodiment of the present invention.

Subsequently, as shown in FIG. 2B, the photoresist layer 100 to be a mask is formed by photolithography. An opening of the photoresist layer 100 in the present state corresponds to an area at which the gate electrode 50 is in contact with the group-III nitride semiconductor layer 10 (an area for functioning as a gate in the HEMT) and also to an area at which the gate electrode 50 functions as a field plate. By applying dry etching to the TEOS oxide layer 42 in that state, an opening can be formed in the TEOS oxide layer 42 having a higher etching rate, as shown in FIG. 2C. After that, by applying wet etching subsequently in that state, the opening (a first opening E) is formed down through the oxide layer 41 located at the lower side, as shown in FIG. 2D. In this process, because the etching rate is higher for the TEOS oxide layer 42 than the oxide layer 41 and the wet etching is isotropic, it is possible to particularly taper the TEOS oxide layer 42 located at the upper side. Subsequently, by removing the photoresist layer 100, a structure shown in FIG. 2E is obtained. As a result of the process, a side surface (a second side surface 42A) of the TEOS oxide layer 42 constituting the first opening E is formed to have a more slanted angle than that of a side surface (a first side surface 41A) of the oxide layer 41 located immediately underneath the TEOS oxide layer 42, and a cross-sectional shape of the first opening E accordingly becomes gradual.

Here, the oxide layer 41 is not opened (etched through) by the dry etching in FIG. 2C, but is opened by the wet etching (FIG. 2D), so that the top surface of the group-III nitride semiconductor layer 10 is exposed. Accordingly, etching of the group-III nitride semiconductor layer 10 during the dry etching and resultant generation of crystal defects are suppressed. Further, by performing the wet etching in a state of having the photoresist layer 100 remaining, wet etching of the top surface of the TEOS oxide layer 42 underneath the photoresist layer 100 is prevented and, as a result, reduction in thickness of the thin TEOS oxide layer 42 during the process is suppressed.

Figure 2F:
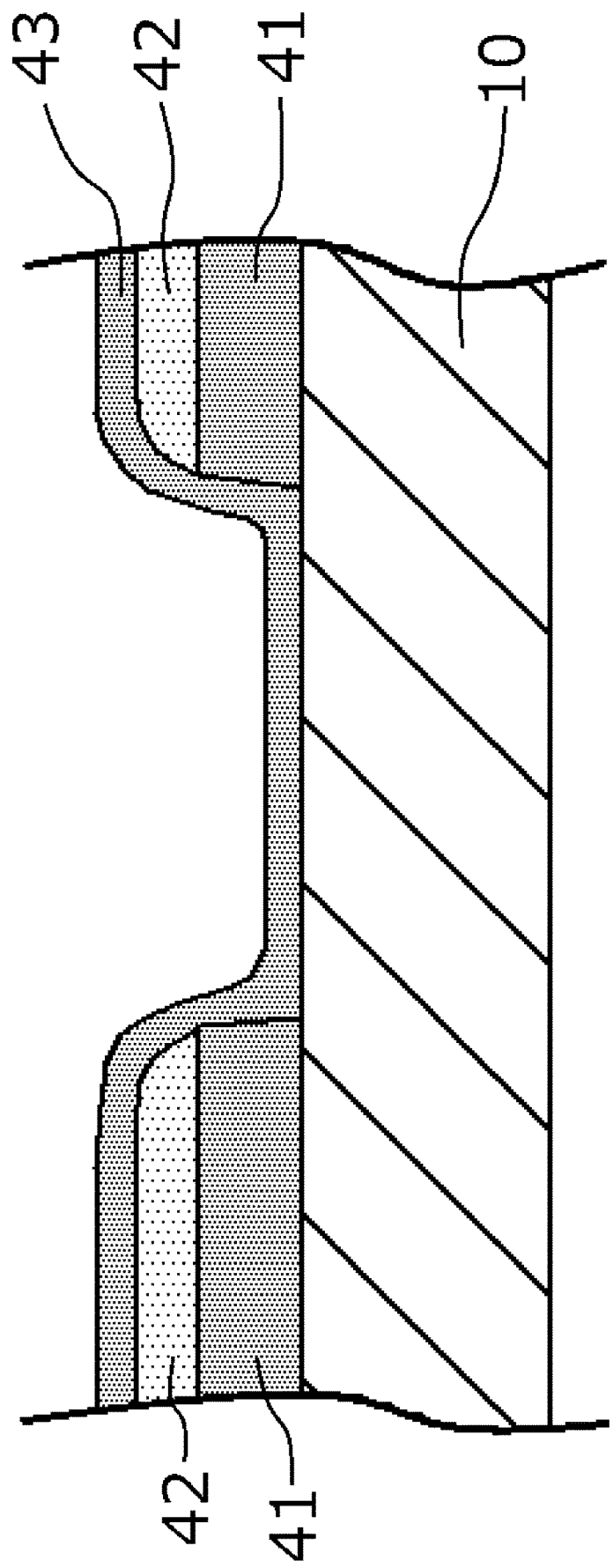
FIG. 2F is a (6th) cross-sectional process diagram showing the fabrication method of the semiconductor device according to the exemplary embodiment of the present invention.

After that, as shown in FIG. 2F, the thin oxide layer 43 is formed on the entire surface. In this process, because the cross-sectional shape of the first opening E has already become gradual, as described above, the oxide layer 43 can be formed with high step coverage entirely over the inside and outside of the first opening E.

Figure 2H:
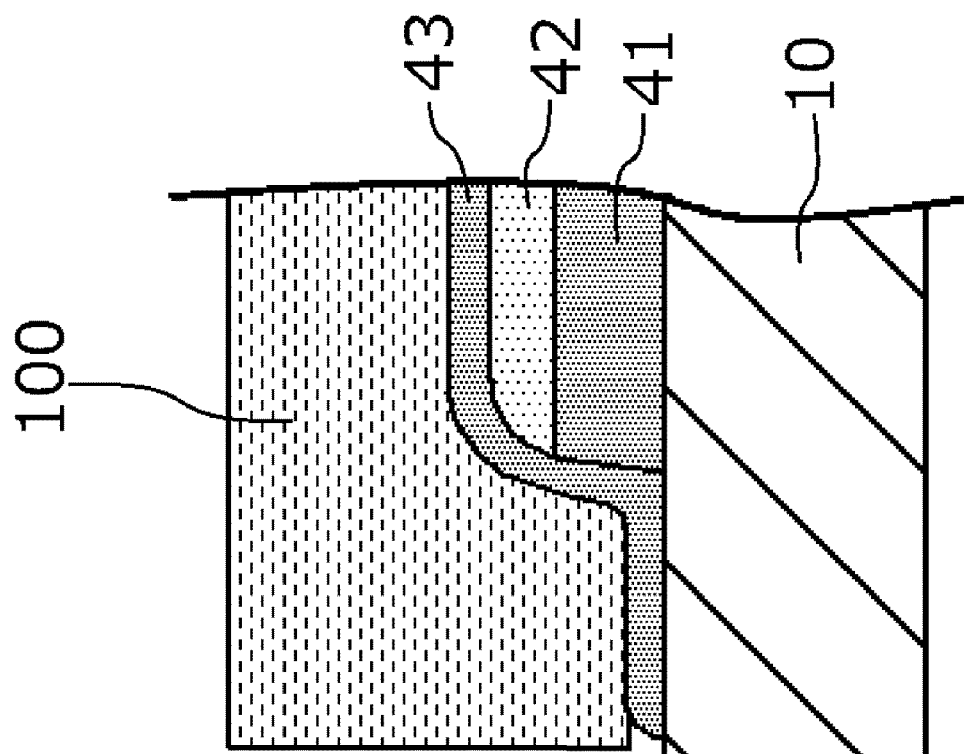
FIG. 2H is a (8th) cross-sectional process diagram showing the fabrication method of the semiconductor device according to the exemplary embodiment of the present invention.
Figure 3I:
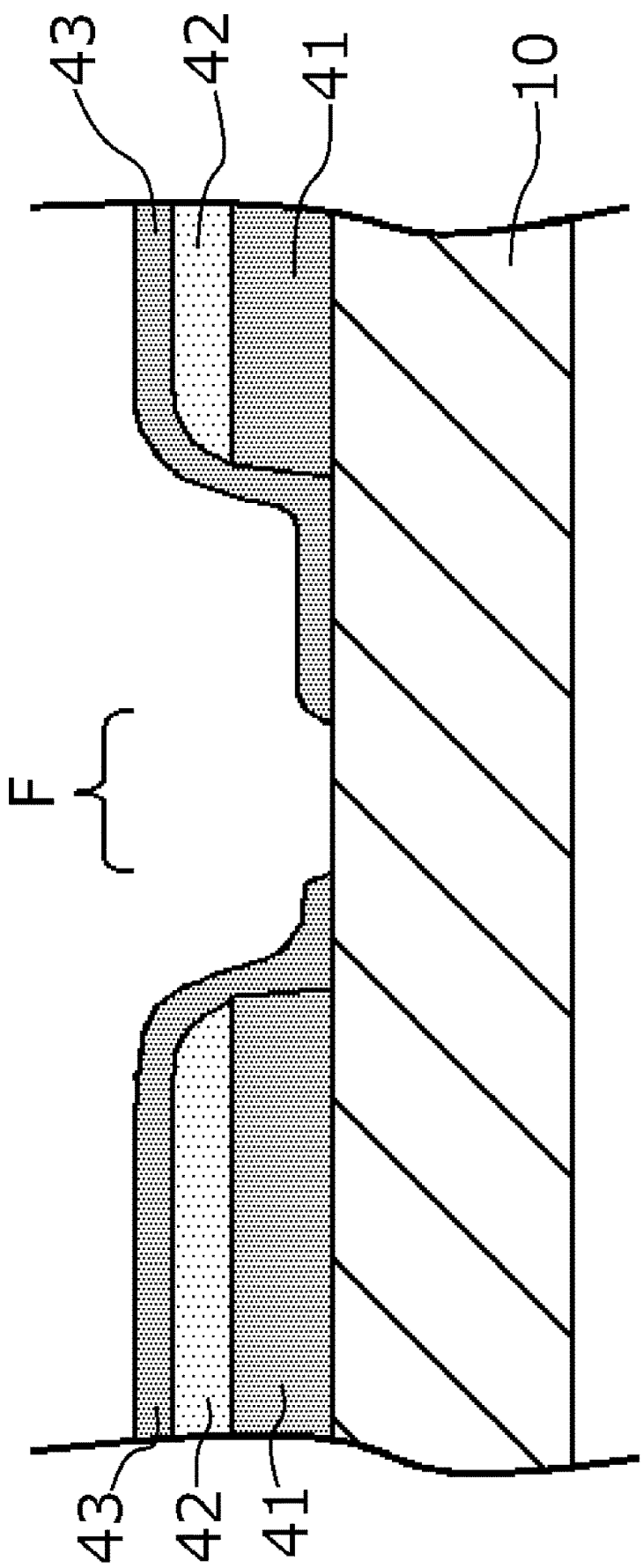
FIG. 3I is a (9th) cross-sectional process diagram showing the fabrication method of the semiconductor device according to the exemplary embodiment of the present invention.

Subsequently, by forming a photoresist layer 100 having an opening corresponding to an area at which the gate electrode 50 is to become in contact with the group-III nitride semiconductor layer 10, as shown in FIG. 2G, and then removing a portion of the oxide layer 43 within the area by wet etching, as shown in FIG. 2H, a second opening F is formed in the oxide layer 43 as shown in FIG. 3I. In this process, because of the formation by wet etching, a slant can be formed also at an end portion of the oxide layer 43 constituting the second opening F.

After that, by forming a material constituting the gate electrode 50 over the entire surface in a manner to fill the inside of a recessed area having been formed as described above, and subsequently patterning the material (forming a photoresist layer 100 as a mask on a portion to be the gate electrode by photolithography and then etching the material by dry etching), the semiconductor device 1 is obtained as shown in FIG. 3J.

Figure 4A:
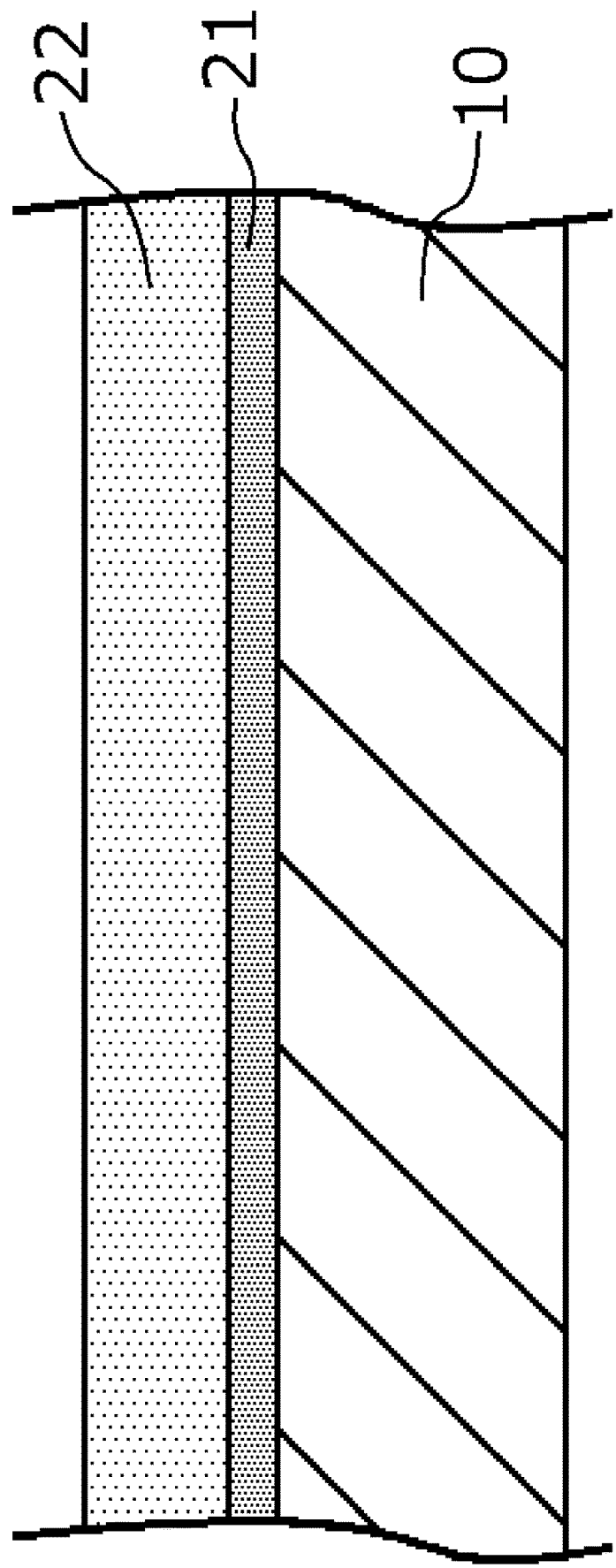
FIG. 4A is a (1st) cross-sectional process diagram showing a fabrication method of a prior art semiconductor device.
Figure 4C:
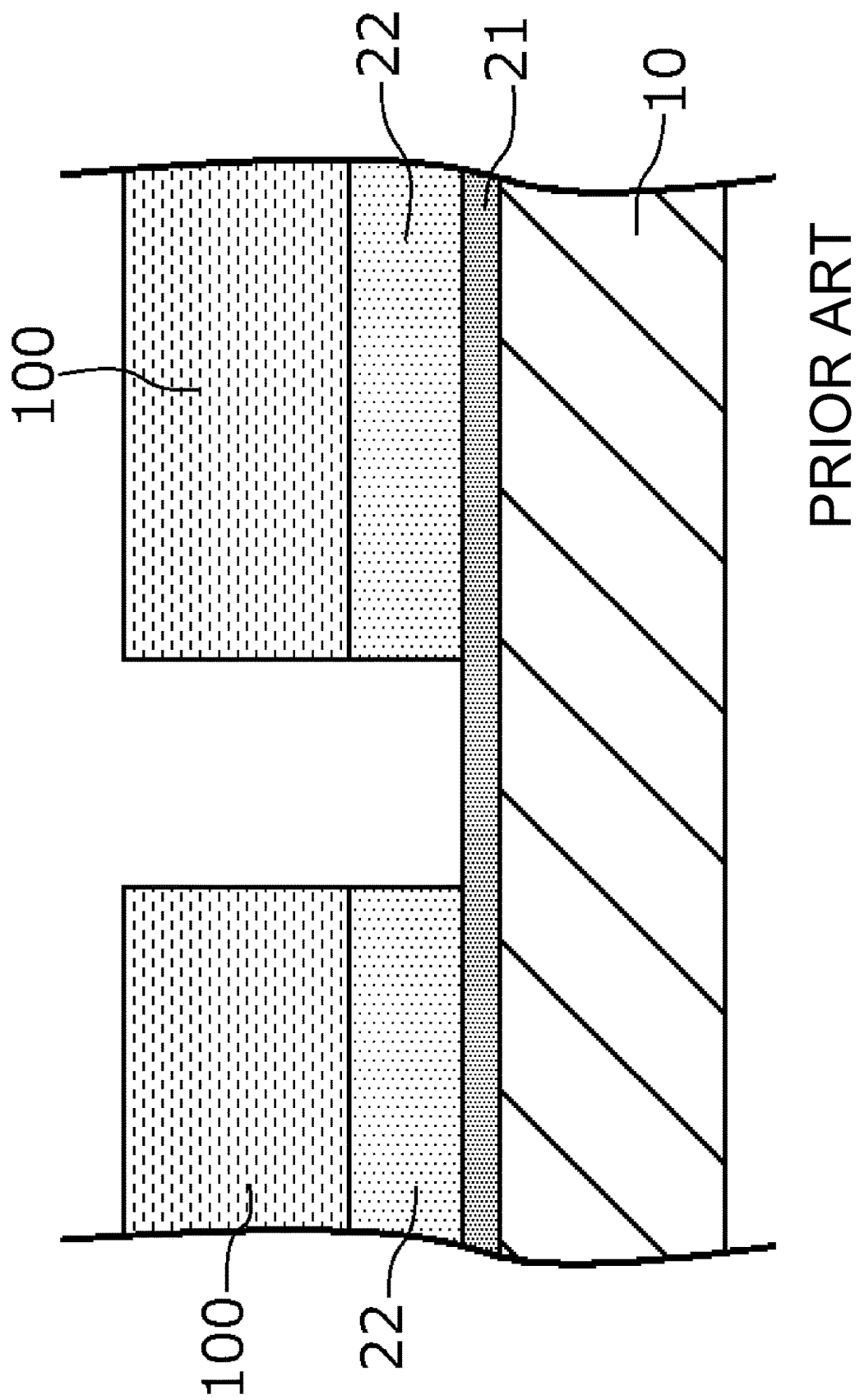
FIG. 4C is a (3rd) cross-sectional process diagram showing the fabrication method of the prior art semiconductor device.
Figure 4E:
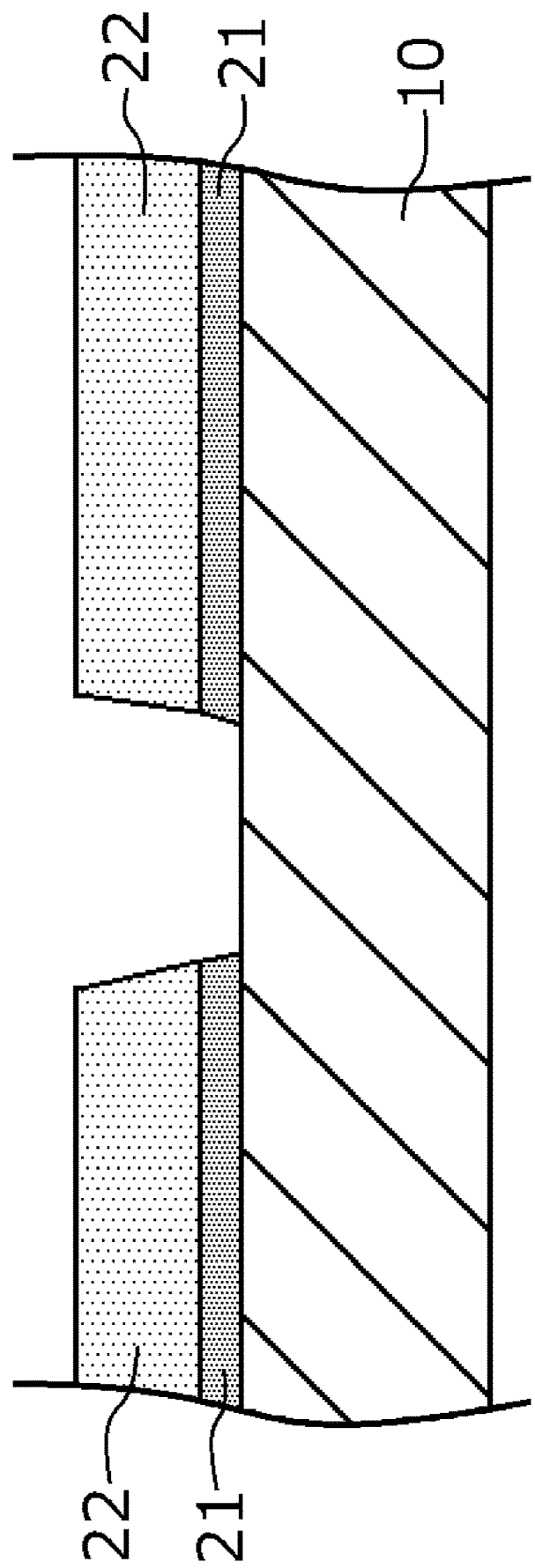
FIG. 4E is a (5th) cross-sectional process diagram showing the fabrication method of the prior art semiconductor device.
Figure 4F:
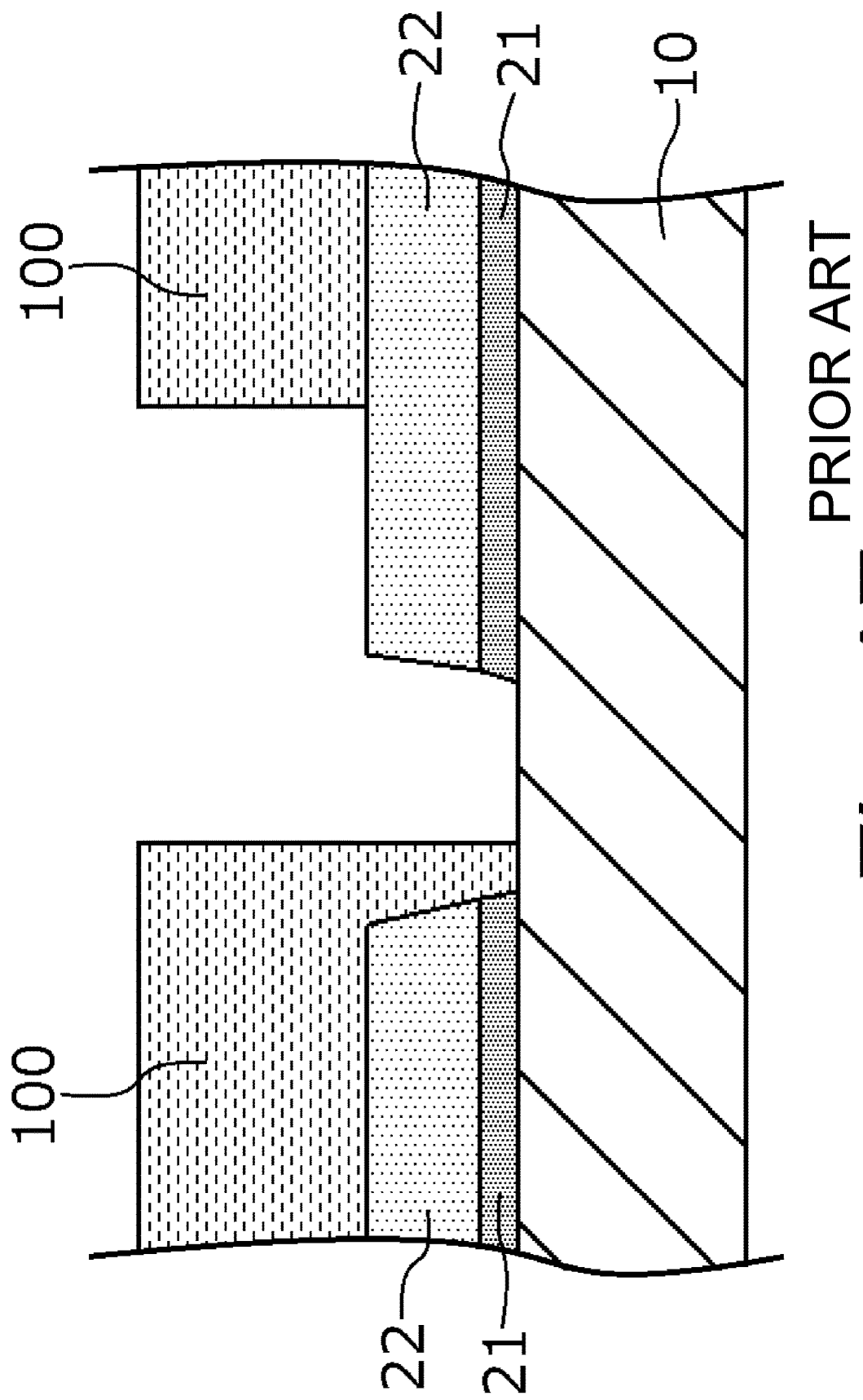
FIG. 4F is a (6th) cross-sectional process diagram showing the fabrication method of the prior art semiconductor device.
Figure 4G:
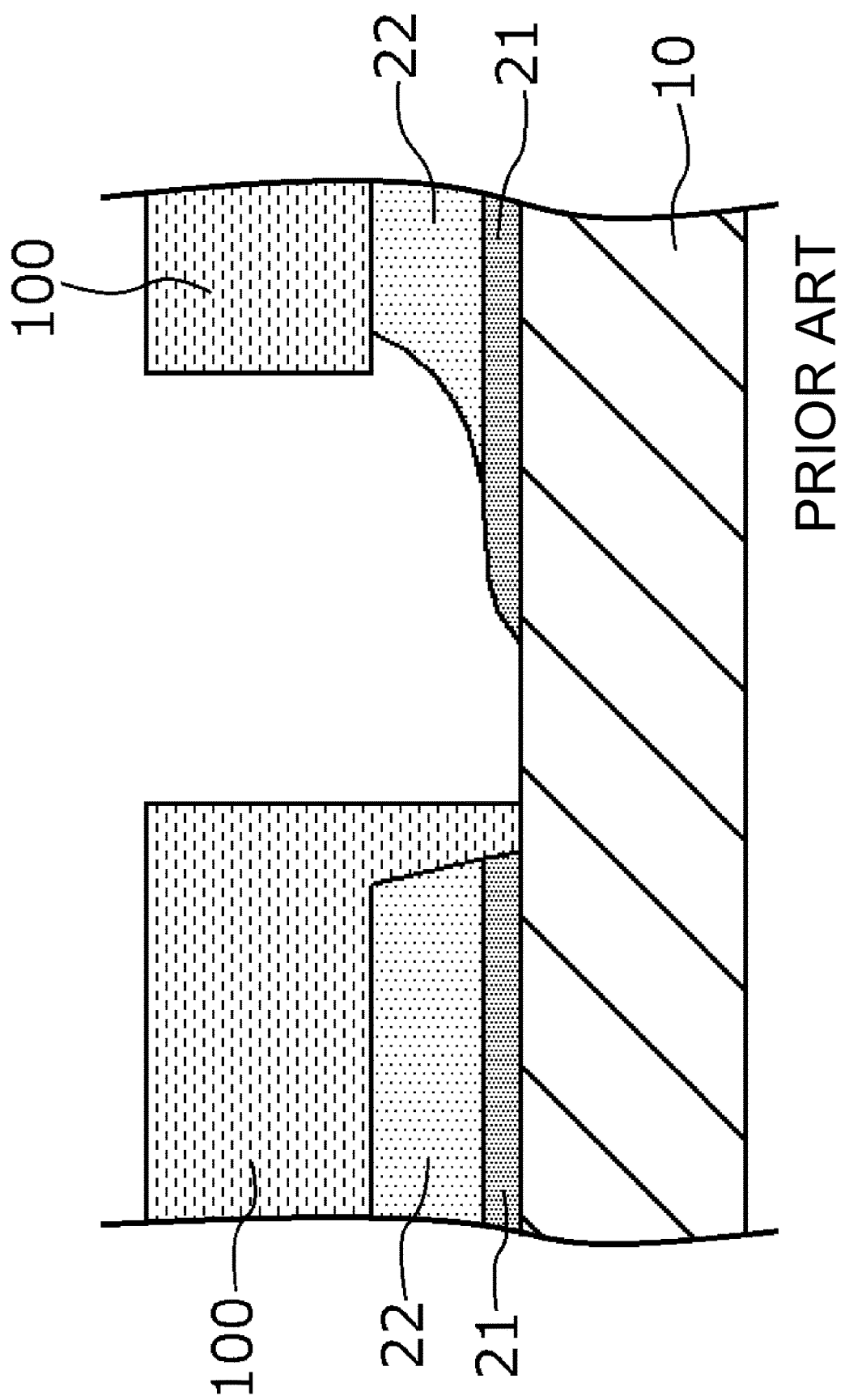
FIG. 4G is a (7th) cross-sectional process diagram showing the fabrication method of the prior art semiconductor device.
Figure 4H:
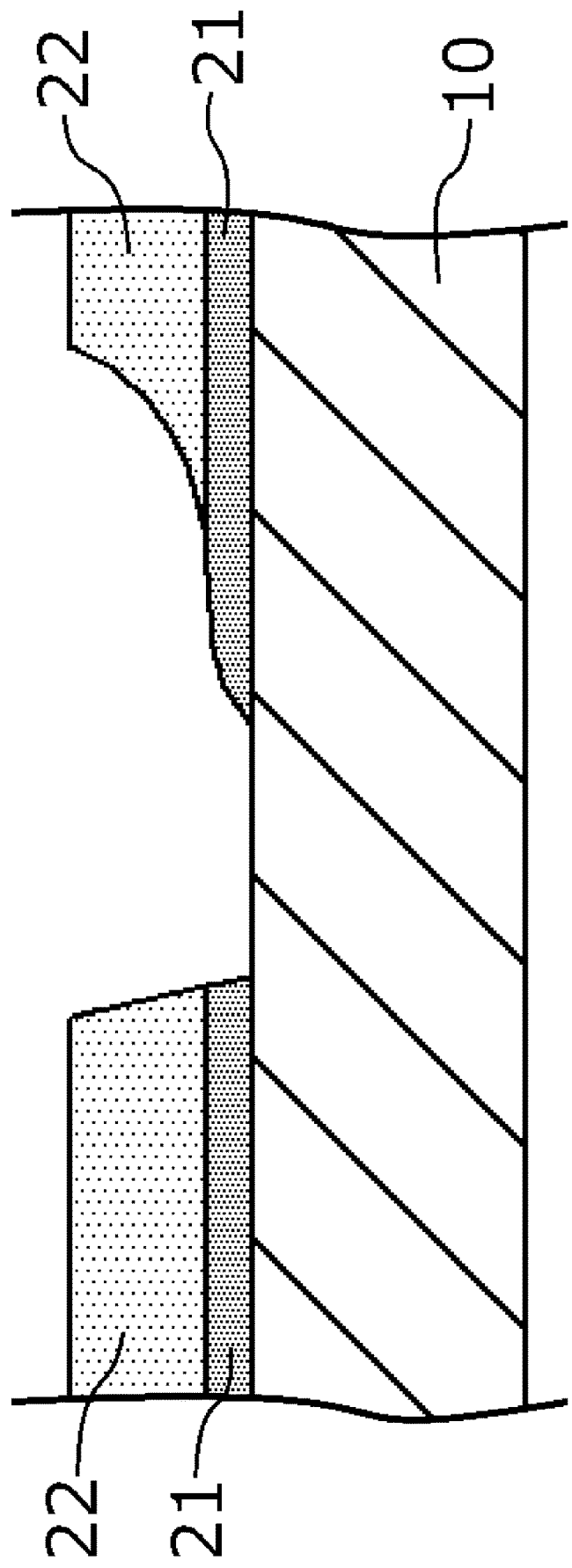
FIG. 4H is a (8th) cross-sectional process diagram showing the fabrication method of the prior art semiconductor device.
Figure 5I:
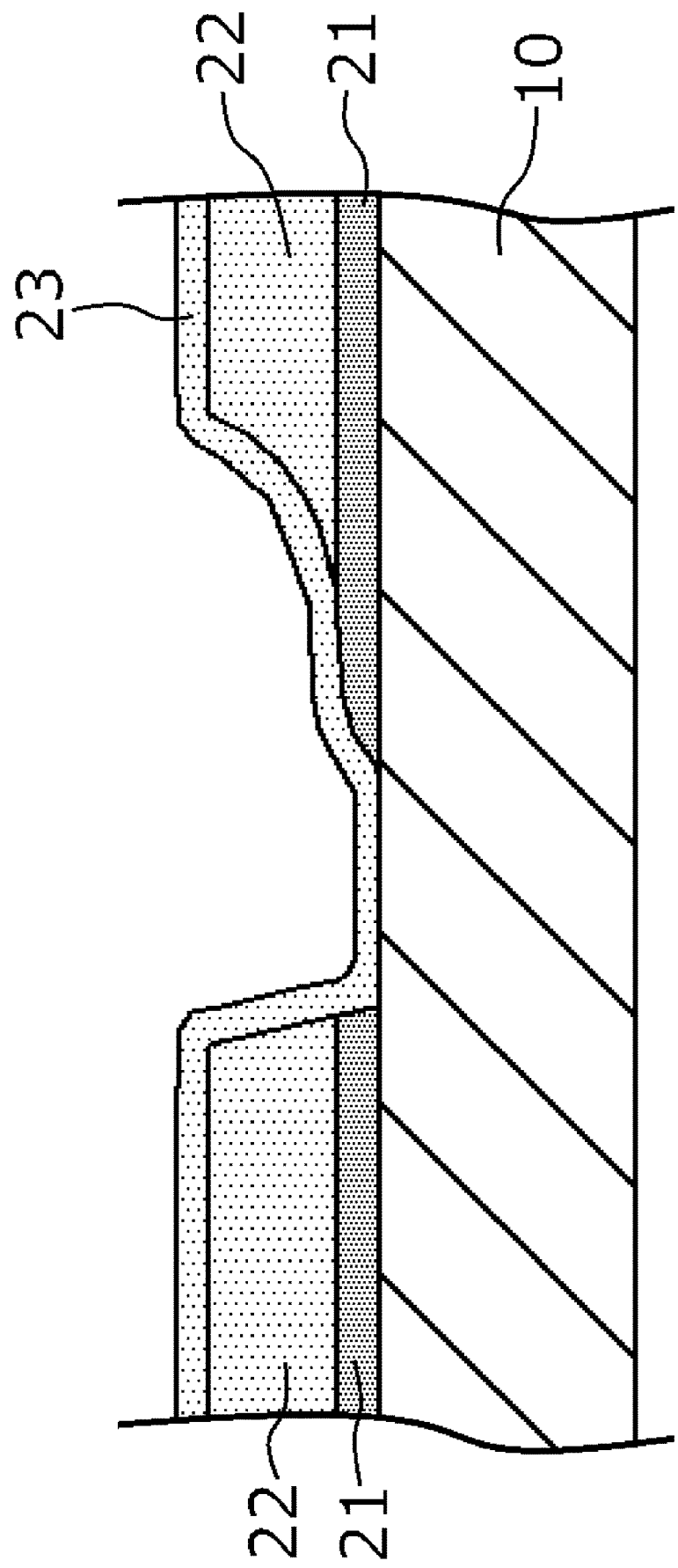
FIG. 5I is a (9th) cross-sectional process diagram showing the fabrication method of the prior art semiconductor device.
Figure 5J:
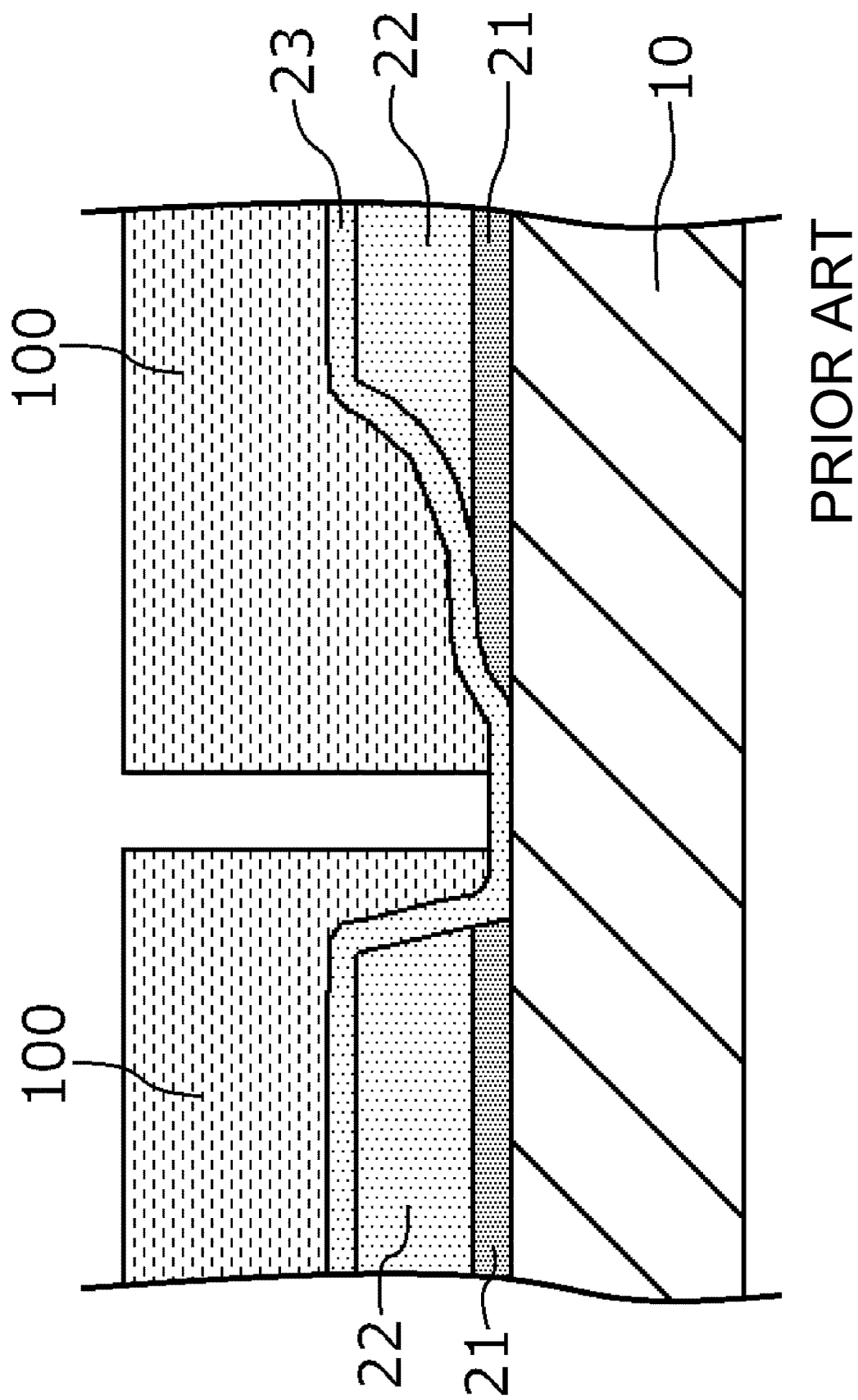
FIG. 5J is a (10th) cross-sectional process diagram showing the fabrication method of the prior art semiconductor device.
Figure 5L:
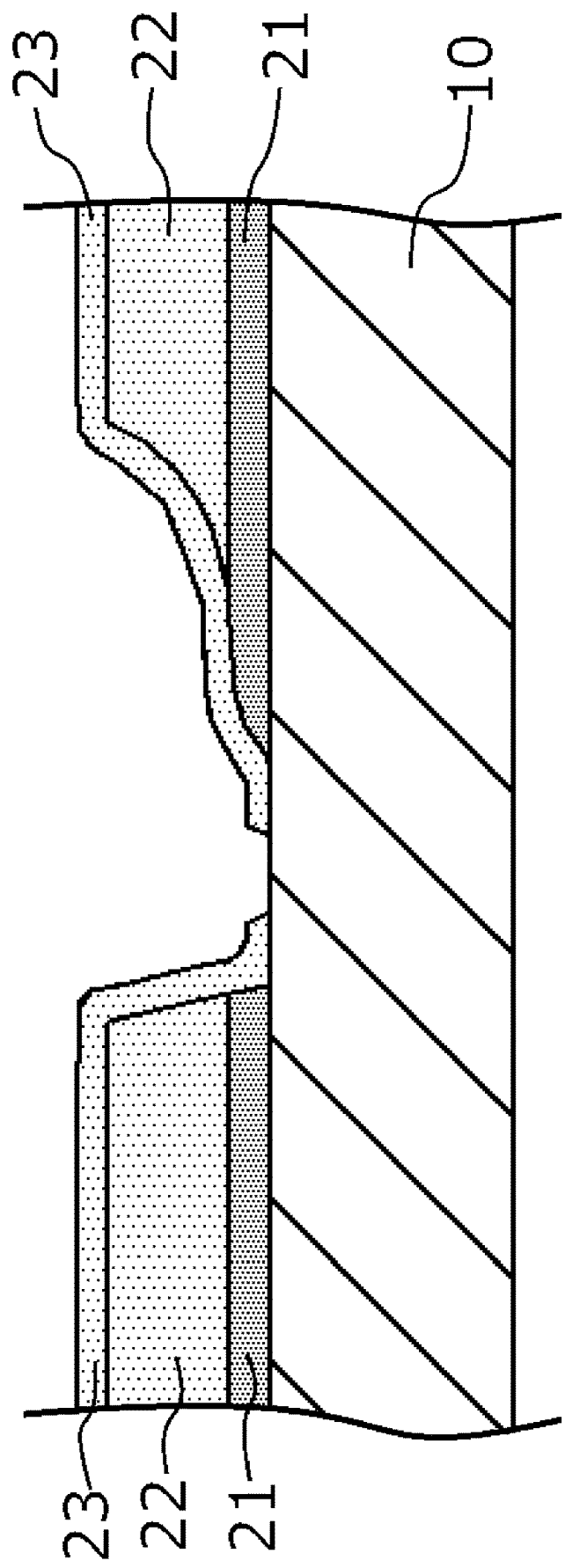
FIG. 5L is a (12th) cross-sectional process diagram showing the fabrication method of the prior art semiconductor device.
Figure 5M:
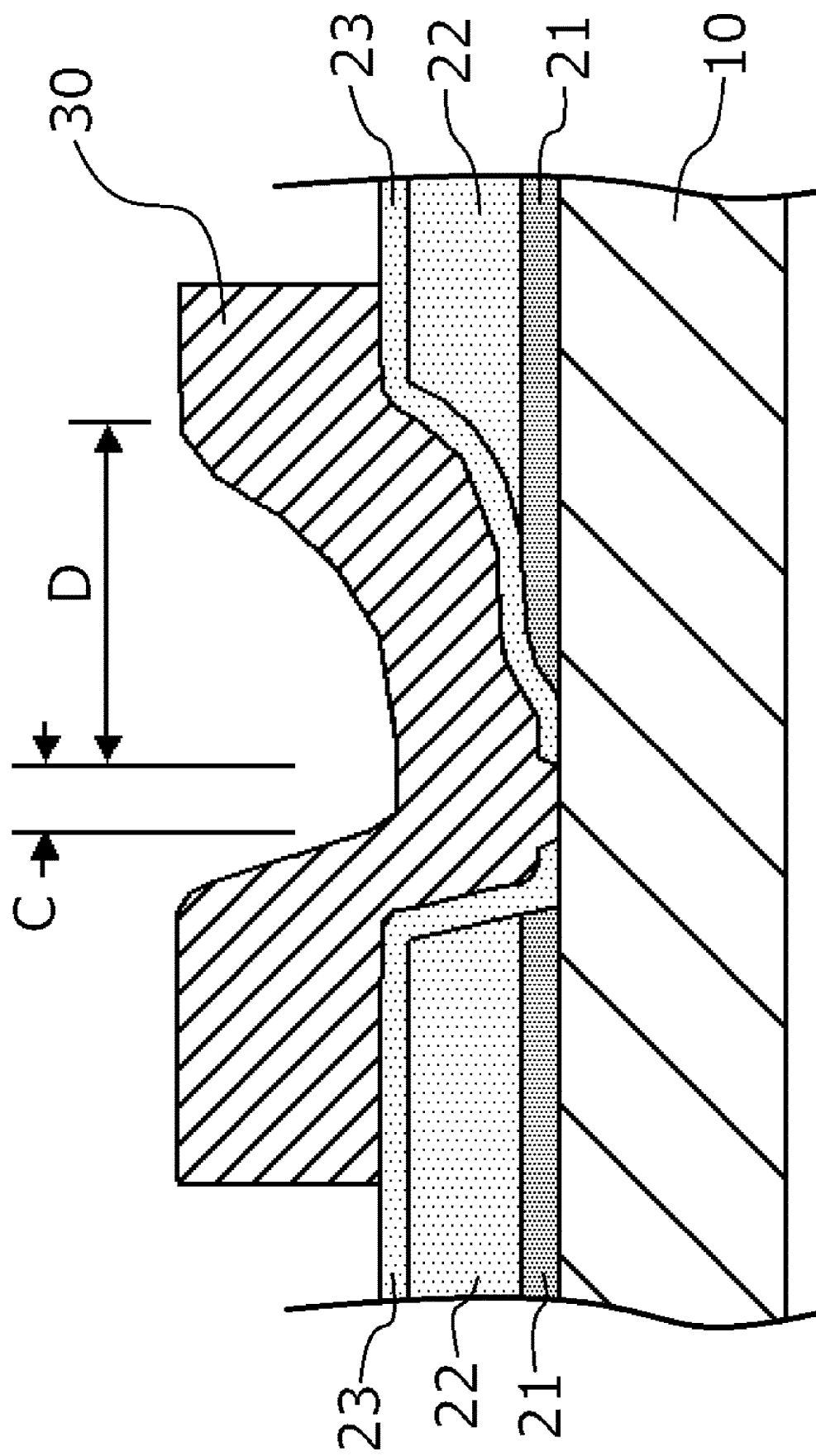
FIG. 5M is a (13th) cross-sectional process diagram showing the fabrication method of the prior art semiconductor device.

In the semiconductor device 9 described earlier, in the area D functioning as a field plate in FIG. 5M, a primary one among the insulating layers between the gate electrode 30 (the field plate) and the group-III nitride semiconductor layer 10 is the oxide layer 21 having been subjected to the wet etching in FIG. 4G. There, it is difficult to precisely control the thickness of the oxide layer 21 immediately underneath the field plate, owing to variability in the wet etching process. Accordingly, variability of the effect as a field plate also becomes large in the semiconductor device 9.

In contrast, in the semiconductor device 1 of FIG. 1, in the area B functioning as a field plate, the insulating layer between the gate electrode 50 (the field plate) and the group-III nitride semiconductor layer 10 is the oxide layer 43 grown in FIG. 2F. There, at least in the area B, the oxide layer 43 never is subjected to wet etching or the like, and its thickness is not different from that at the time of its growth (that in FIG. 2F). Because the thickness of the oxide layer 43 at the time of its growth can be controlled with high precision, it is accurately controlled and, accordingly, variability of the effect of the field plate in the area B is small.

While wet etching is used even in the above-described semiconductor device 1 for controlling the taper angle of the end surface in the first opening, as shown in FIG. 2E, the etching time is short (the etching amount is small) and, accordingly, variability of a shape formed by the etching is small. Further, because the area B portion of the gate electrode 50 to function as a field plate is present inside the first opening E, even if variability in shape and thickness occurs in the etching, influence of the variability on the effect as the field plate also is small. As a result, variability of the semiconductor device 1 in characteristics can be reduced.

Further, comparing the fabrication method of the semiconductor device 9 described earlier (FIGS. 4 and 5) with that of the present semiconductor device 1 (FIGS. 2 and 3), in contrast to that photolithography (forming the photoresist pattern 100) is performed three times in the former method, it is performed only twice, for forming respectively the first and the second openings, in the latter method. As a result, the present semiconductor device 1 can be fabricated at low cost.

In the present structure described above, the TEOS oxide layer 42 plays a role mainly in making gradual a slant of the surface of the insulating layer immediately underneath the gate electrode 50 (field electrode). However, when the TEOS oxide is too thin, the effect of making the step portion gradual becomes small. For this reason, the thickness of the TEOS oxide layer 42 formed in FIG. 2A preferably is set to be within a range of 0.2 to 0.5 µm and, in association with that, the thickness of the oxide layer 41 preferably is set to be larger than that of the TEOS oxide layer 42 and be within a range of 0.35 to 0.75 µm. The thickness of the oxide layer 43 preferably is set to be smaller than that of the oxide layer 41 and be within a range of 0.05 to 0.3 µm, in order to increase the effect of the field plate.

There may be a case where current collapse occurs as a result of the TEOS oxide layer 42 being a cause. In that case, the current collapse can be relaxed by setting the oxide layer 41 to be thicker than the TEOS oxide layer 42.

While, in the example described above, the field plate structure (a portion functioning as a field plate) is provided in the gate electrode, similar structure and fabrication method may be employed when providing a field plate structure also in another electrode (a source electrode or a drain electrode) on the group-III nitride semiconductor layer 10.

In the example described above, as insulating layers on the group-III nitride semiconductor layer (semiconductor layer) 10, the oxide layer (first insulating layer) 41, the TEOS oxide layer (second insulating layer) 42 and the oxide layer (third insulating layer) 43 are employed, where a plasma silicon oxide layer is used for each of the first and the third insulating layers, and a TEOS oxide layer for the second insulating layer. However, any kind of layer may be used for the insulating layers as long as it allows realization of a similar configuration to that described above.

In such a case, an insulating layer containing a small amount of impurity and having an excellent interface characteristic with the semiconductor layer may be used for the first and the third insulating layers which are to be in direct contact with the semiconductor layer and, for the second insulating layer, an insulating layer having a higher etching rate than that of the first insulating layer and enabling easy realization of the shape shown in FIG. 2E is particularly preferable. Further, it is not necessarily required to use the same kind of insulating layer for the third and the first insulating layers. Moreover, for example, it is general that insulating layers are different in impurity and film quality depending on growth conditions and, accordingly, the above-described semiconductor device may be fabricated using different growth conditions for the respective insulating layers.

While the above-described example is a semiconductor device in which the semiconductor layer is a GaN layer, the above-described structure is similarly effective in any semiconductor device in which the field plate structure is effective. Materials to constitute such a semiconductor layer include other group-III nitride semiconductors than GaN.

What is claimed is:

1. A semiconductor device using an electrode layer formed on a portion of an insulating layer formed on a semiconductor layer,
   the insulating layer comprising:
   a first insulating layer being in contact with the semiconductor layer and a second insulating layer formed on the first insulating layer;
   a first opening formed to pass through both the second insulating layer and the first insulating layer;
   a third insulating layer formed continuously in a manner to cover an inside of the first opening and with a smaller thickness than that of the first insulating layer; and
   a second opening for exposing the semiconductor layer formed at a portion of the third insulating layer inside the first opening,
   the second insulating layer being thinner than the first insulating layer,
   compared to a first side surface of the first insulating layer constituting the first opening, a second side surface of the second insulating layer present immediately above the first side surface and constituting the first opening being configured to be more gradual, and
   the electrode layer being in contact with both the first side surface and the second side surface.

2. The semiconductor device according to claim 1, wherein the first insulating layer and the third insulating layer are each composed of a plasma silicon oxide layer, and the second insulating layer is composed of a TEOS oxide layer.

3. The semiconductor device according to claim 2, wherein a thickness of the third insulating layer is within a range of 0.05 to 0.3 µm.

4. The semiconductor device according to claim 1, wherein the semiconductor layer is composed of a group-III nitride semiconductor.

* * * * *